(12) United States Patent
Jia et al.

(10) Patent No.: US 9,335,596 B2
(45) Date of Patent: May 10, 2016

(54) ARRAY SUBSTRATE, DISPLAY DEVICE, AND REPAIR METHOD FOR THE ARRAY SUBSTRATE

(71) Applicants: BOE TECHNOLOGY GROUP CO., LTD., Beijing (CN); BEIJING BOE DISPLAY TECHNOLOGY CO., LTD., Beijing (CN)

(72) Inventors: Pijian Jia, Beijing (CN); Woong Sun Yoon, Beijing (CN); Zhaohui Hao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 46 days.

(21) Appl. No.: 14/355,327
(22) PCT Filed: Dec. 14, 2013
(86) PCT No.: PCT/CN2013/089450
§ 371 (c)(1),
(2) Date: Apr. 30, 2014
(87) PCT Pub. No.: WO2014/201822
PCT Pub. Date: Dec. 24, 2014

(65) Prior Publication Data
US 2015/0277198 A1 Oct. 1, 2015

(30) Foreign Application Priority Data
Jun. 20, 2013 (CN) .......................... 2013 1 0246883

(51) Int. Cl.
*H01L 23/48* (2006.01)
*H01L 23/52* (2006.01)
(Continued)

(52) U.S. Cl.
CPC ........ *G02F 1/136259* (2013.01); *G02F 1/1309* (2013.01); *G02F 1/1368* (2013.01);
(Continued)

(58) Field of Classification Search
USPC ......... 257/57, 59, 72, 83, 290, 351, 368, 392, 257/E29.003, E29.295, 66, E21.7, 257/252–254, 257–258; 438/30, 48, 128, 438/149, 151, 157, 161, 283, 163, 33, 24
See application file for complete search history.

(56) References Cited

U.S. PATENT DOCUMENTS

2006/0194425 A1* 8/2006 Takano .................... C09J 9/02
438/618
2008/0084530 A1* 4/2008 Hirabayashi ......... H01R 13/025
349/150
(Continued)

FOREIGN PATENT DOCUMENTS

CN 101334536 A 12/2008
CN 101435924 A * 5/2009 ............. G01R 31/00
(Continued)

OTHER PUBLICATIONS

International Search Report mailed Mar. 27, 2014; PCT/CN2013/089450.
(Continued)

*Primary Examiner* — Dao H Nguyen
*Assistant Examiner* — Tram H Nguyen
(74) *Attorney, Agent, or Firm* — Ladas & Parry LLP

(57) ABSTRACT

Embodiments of the present invention disclose an array substrate, a display device and a repair method of the array substrate. The array substrate comprises a display region; a peripheral region, in which a peripheral circuit including a plurality of leading wires is provided, and the peripheral region including: an insulation layer, provided above a layer in which the peripheral circuit is provided; and a leading wire repair layer, provided above the insulation layer, wherein the leading wire repair layer includes at least two common repair lines extended along an arrangement direction of the leading wires in the peripheral circuit, and a plurality of repair lines electrically connected the at least two common repair lines are provided between the two adjacent common repair lines.

14 Claims, 2 Drawing Sheets

(51) Int. Cl.
- H01L 29/40 (2006.01)
- G02F 1/1362 (2006.01)
- G02F 1/13 (2006.01)
- G02F 1/1333 (2006.01)
- G02F 1/1343 (2006.01)
- G02F 1/1368 (2006.01)
- H01L 27/12 (2006.01)

(52) U.S. Cl.
CPC ...... G02F1/13439 (2013.01); G02F 1/133345 (2013.01); H01L 27/124 (2013.01); G02F 2001/136263 (2013.01)

(56) References Cited

U.S. PATENT DOCUMENTS

2010/0320909 A1\* 12/2010 Izumi ............... H01L 27/3246 315/51

2012/0105755 A1\* 5/2012 Zen ..................... G02F 1/13452 349/42

FOREIGN PATENT DOCUMENTS

| CN | 101435924 A | 5/2009 |
| CN | 101435925 A | 5/2009 |
| CN | 101930128 A | 12/2010 |
| CN | 103353679 A | 10/2013 |

OTHER PUBLICATIONS

First Chinese Office Action Appln. No. 201310246883.X; Dated Apr. 3, 2015.

Interntaional Preliminary Report on Patentability Appln. No. PCP/CN2013/089450; Dated Dec. 22, 2015.

\* cited by examiner

ARRAY SUBSTRATE, DISPLAY DEVICE, AND REPAIR METHOD FOR THE ARRAY SUBSTRATE

TECHNICAL FIELD

The embodiments of the present invention relate to an array substrate, a display device and a repair method for the array substrate.

BACKGROUND

In the liquid crystal display technology field, a thin film transistor liquid crystal display (TFT-LCD) is widely used in a television, a computer, a mobile phone and so on for its advantages such as large size, high integration level, strong function, flexible process and low cost.

A display panel is a main component of the TFT-LCD, and is generally made by cell-assembling an array substrate and a color filter substrate and injecting liquid crystal between the two substrates. The array substrate comprises a plurality of gate lines for providing on-off scan signals and a plurality of data lines for providing data scan signals, the gate lines and the data lines are usually connected to leading wires in a peripheral circuit. During a manufacturing process of the array substrate, due to a complex process, there is possible that the leading wire in the peripheral circuit is broken, and thus causing the gate lines or the data lines can not be effectively input signals, and even causing the failure of the whole panel. Currently, for the array substrate manufactured by a conventional process, the broken leading wire in the peripheral circuit cannot be quickly and effectively repaired, and thus the production efficiency is degraded and the resource is wasted.

SUMMARY

The embodiments of the present invention provide an array substrate, a display device and a repair method for the array substrate, by which a leading wire in a peripheral circuit can be quickly and effectively repaired after a breakage occurs during a manufacturing process of the array substrate, and thus the production efficiency is improved, and the waste of the resource is avoid.

In one aspect, the embodiment of the present invention provides an array substrate, comprising: a display region; a peripheral region, in which a peripheral circuit comprising a plurality of leading wires spaced from each other are provided, and the peripheral region comprising: an insulation layer, provided above a layer in which the peripheral circuit is provided; and a leading wire repair layer, provided above the insulation layer, wherein the leading wire repair layer comprises at least two common repair lines extended along an arrangement direction of the leading wires in the peripheral circuit, and a plurality of repair lines electrically connected the at least two common repair lines are provided between the two adjacent common repair lines.

In another aspect, the embodiment of the present invention provides a display device, comprising: the array substrate as above described and an opposed substrate cell-assembled with the array substrate.

In still another aspect, the embodiment of the present invention provides a repair method for the above array substrate, comprising the following steps: S21, when the leading wire in the peripheral circuit is broken, two ends at a breakage point of the broken leading wire in the peripheral circuit are fused with the common repair lines at overlap positions where the broken leading wire are intersected with the common repair lines, to form a first fuse point and a second fuse point electrically connecting the broken leading wire and the common repair lines; and S22, selecting one repair line which is nearest to the first fuse point and the second fuse point, to form a connecting line from the first fuse point to the second fuse point, and disconnecting the connecting line from the common repair line so that the connecting line is used to take the place of the broken leading wire in the peripheral circuit.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
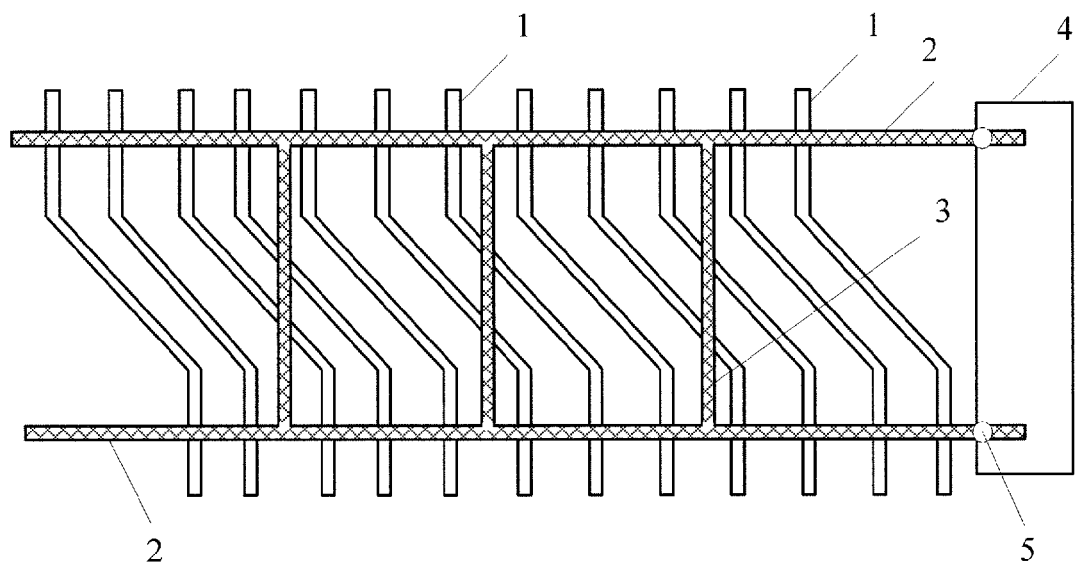
FIG. 1 is a partially schematic view showing a structure of an array substrate according to an embodiment of the present invention.

A first embodiment of the present invention provides an array substrate, as shown in FIG. 1, the array substrate comprises a display region and a peripheral region in which a peripheral circuit is provided. The peripheral circuit comprises a plurality of leading wires 1 spaced from each other. The peripheral region comprises: an insulation layer (not shown), provided above a layer in which the leading wires are provided; a leading wire repair layer (not shown), provided above the insulation layer and comprising at least two common repair lines 2 extended along an arrangement direction of the leading wires of the peripheral circuit, wherein a plurality of repair lines 3 electrically connected to two adjacent common repair lines 2 are provided between the two adjacent common repair lines 2.

It is noted that for convenient description, in the present embodiment, the leading wire 1 in the peripheral circuit is shown in a zigzag form in FIG. 1, but in practical, the leading wire 1 may formed in other various forms.

Exemplarily, the insulation layer is further provided with through holes 5 for electrically connecting the common repair lines 2 and a common electrode 4. There are a plurality of the through holes 5 disposed and distributed in different positions. The through holes 5 may be filled with conductive material for electrically connecting the common repair lines 2 to the common electrode 4, which can be regarded as electrically connecting the leading wire repair layer with a layer in which the common electrode is disposed, so that a electrostatic breakdown of the leading wire repair layer due to static electricity accumulation during the manufacturing process can be prevented.

Exemplarily, at least two of the common repair lines 2 are respectively provided in set regions close to both ends of the leading wires 1 in the peripheral circuit, and the set region can be set according to a practical wiring or the damage probability of the leading wires 1.

Exemplarily, the number of the repair lines 3 may be the same as the number of the leading wires 1 in the peripheral circuit and the repair lines 3 may be in a one-to-one correspondence relationship with the leading wires 1 in a position, but it is to be noted that if the repair lines 3 are arranged too densely, the normal operation of the array substrate will be disturbed and too much material will be used to form the repair lines 3. Therefore, the number of the repair lines 3 may be less than the number of the leading wires 1 in the peripheral circuit, and there are at least two leading wires 1 in the peripheral circuit between two adjacent repair lines 3.

Exemplarily, the repair line may be perpendicular to the common repair line, or, the repair line may be parallel with a segment of the leading wire in the peripheral circuit.

Exemplarily, the common repair lines and the repair lines may be made from Cr, W, Cu, Ti, Ta, Mo or ITO.

Exemplarily, the insulation layer is one of a silicon oxide film, a silicon nitride film, a silicon oxynitride film and a composite structure comprising at least two above films.

The benefit of the embodiment of the present invention is as follows: the leading wire repair layer comprising the common repair lines and the repair lines is provided above a layer in which the peripheral circuit in the peripheral region is disposed, when a leading wire is broken, based on a position of the broken leading wire, a suitable repair line and a part of the common repair line are selected to form a connecting line to take the place of the broken leading wire. Thus, the broken leading wire in the peripheral circuit of the array substrate can be quickly and effectively repaired, production efficiency is improved, and the resource is saved.

In addition, a second embodiment of the present invention provides a display device comprising the above mentioned array substrate and an opposed substrate cell-assembled with the array substrate.

A third embodiment of the present invention provides a method for manufacturing an array substrate, the method comprises the following steps:

Step S11, forming gate lines, data lines and a common electrode in a display region on a substrate, and forming a peripheral circuit in a peripheral region, the peripheral circuit comprises a plurality of leading wires which are spaced from each other and electrically connected to the gate lines or the data lines.

Step S12, forming an insulation layer above a layer in which the peripheral circuit is disposed on the substrate formed in step S11, wherein there are through holes formed in the insulation layer, and the insulation layer may be one of a silicon oxide film, a silicon nitride film, a silicon oxynitride film and a composite structure comprising at least two above films, and the through holes are filled with conductive material.

Step S13, forming a leading wire repair layer in the peripheral region of the substrate formed in the above step S12, the leading wire repair layer is provided above the insulation layer, and the leading wire repair layer may be made from a metal such as Cr, W, Cu, Ti, Ta, Mo or ITO. Alternatively, the leading wire repair layer can be made from other materials capable of achieving an object of an embodiment of the present invention, thus herein, it is not limited.

The leading wire repair layer comprises at least two common repair lines which are extended along an arrangement direction of the leading wires of the peripheral circuit. The two adjacent common repair lines respectively correspond to two ends of the leading wires of the peripheral circuit, each of the common repair lines corresponds to one end of the leading wires of the peripheral circuit, and a plurality of repair lines are disposed between the two adjacent common repair lines and the plurality of repair lines are electrically with the two adjacent common repair lines. The common repair line is connected with the common electrode by the through holes. Alternatively, the through holes are provided in plural and distributed at different positions for the purpose of connecting the common repair line with the common electrode without influencing the repair to the leading wire of the peripheral circuit by the common repair line. Connecting the common repair line with the common electrode is equivalent to connecting the leading wire repair layer with a layer where the common electrode is disposed, which will prevent the leading wire repair layer from being electrostatic breakdown by the static electricity accumulation during the manufacturing process.

Exemplarily, the number of the repair lines 3 may be the same as the number of the leading wires 1 in the peripheral circuit and the repair lines 3 may be in a one-to-one correspondence relationship with the leading wires 1 in a position. Alternatively, the number of the repair lines 3 may be less than the number of the leading wires 1 in the peripheral circuit, and there are at least two leading wires 1 in the peripheral circuit between two adjacent repair lines 3.

Exemplarily, the repair line may be perpendicular to the common repair line, or, the repair line may be parallel with a segment of the leading wire in the peripheral circuit.

The benefit of the present embodiment is as follows: the leading wire repair layer comprising the common repair lines and the repair lines are provided on the array substrate on which the gate lines, the data lines, the peripheral circuit and the common electrode are formed, when any one of the leading wires is broken, according to a position of the broken leading wire, a suitable repair line and a part of the common repair line are selected to form a connecting line to take the place of the broken leading wire. Thus, the broken leading wire in the peripheral circuit of the array substrate can be quickly and effectively repaired, production efficiency is improved, and the resource is saved.

A fourth embodiment of the present invention provides a repair method for the above array substrate, the method comprises the following steps:

S21, when a leading wire in the peripheral circuit is broken, two ends at a breakage point of the broken leading wire in the peripheral circuit are fused with the common repair lines at overlap positions where the broken leading wire are intersected with the common repair lines, to form a first fuse point and a second fuse point electrically connecting the broken leading wire and the common repair lines.

S22, Selecting one repair line which is nearest to the first fuse point and the second fuse point, to form a connecting line from the first fuse point to the second fuse point, and disconnecting the connecting line from the common repair line so that the connecting line is used to take the place of the broken leading wire in the peripheral circuit.

Exemplarily, the common repair lines for fusing are two common repair lines, which are nearest to the two ends at the breakage point of the broken leading wire.

The benefit of the present embodiment is as follows: based on the leading wire repair layer comprising the common repair lines and the repair lines disposed on the substrate, when any one of the leading wires in the peripheral circuit is broken, according to a position of the broken leading wire, a suitable repair line and a part of the common repair line are selected to form a connecting line to take the place of the broken leading wire. Thus, the broken leading wire in the peripheral circuit of the array substrate can be quickly and effectively repaired, production efficiency is improved, and the resource is saved.

Figure 2:
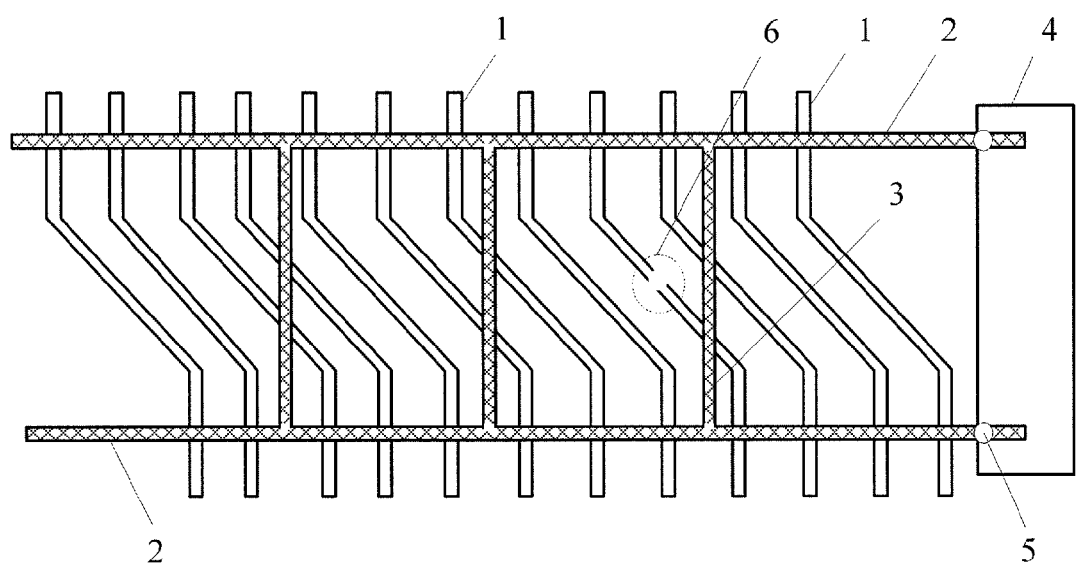
FIG. 2 is a partially schematic view showing an array substrate in which a leading wire is broken, according to an embodiment of the present invention.

Exemplarily, the repair method for the array substrate as provided by the embodiment of the present invention will be described with reference to the attached drawings. The array substrate to be repaired is shown in FIG. 1, and the array substrate comprising a broken leading wire in the peripheral circuit is schematically shown in FIG. 2, in which a breakage point 6 of a leading wire 1 is shown.

Figure 3:
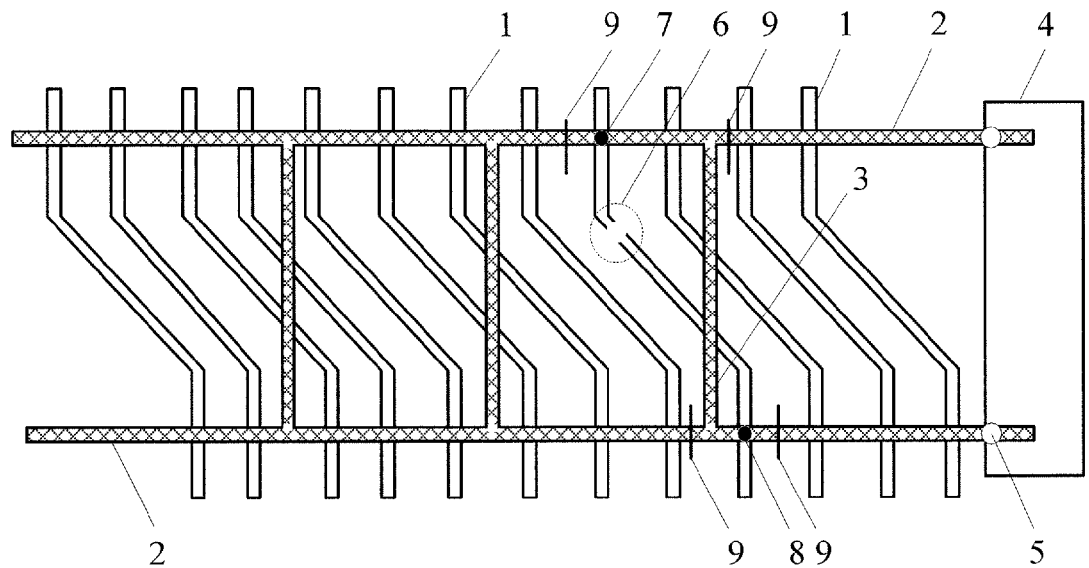
FIG. 3 is a partially schematic view showing an array substrate in which the broken leading wire in the peripheral circuit is repaired, according to an embodiment of the present invention.

At intersection positions where two ends at the breakage point of the broken leading wire 1 in the peripheral circuit on the array substrate are intersected with the common repair lines 2, the leading wire 1 is fused with the common repair lines 2. The intersection position is an overlap position where the common repair line 2 is intersected with the leading wire 1 when the common repair line 2 is provided in a set region adjacent to the two ends of the leading wire in the peripheral circuit. As shown in FIG. 3, after the above step, a first fuse point 7 and a second fuse point 8 are formed which connect the broken leading wire 1 in the peripheral circuit with the common repair line 2.

Figure 4:
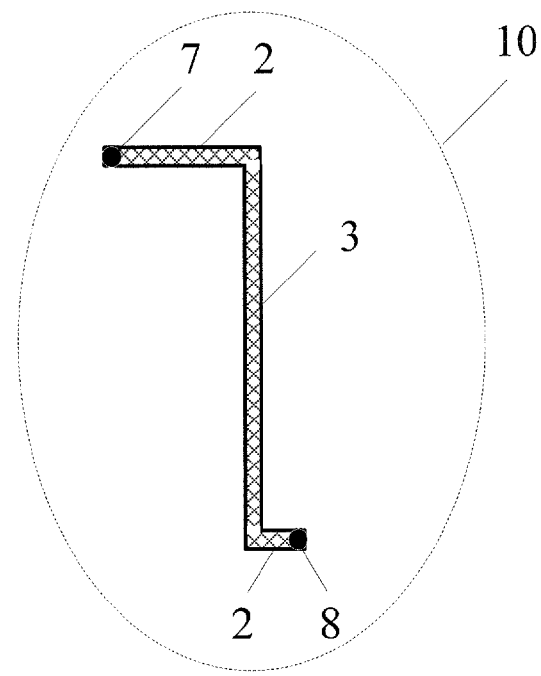
FIG. 4 is a schematic view showing a connecting line according to an embodiment of the present invention.

A repair line 3 and parts of the common repair lines between the first fuse point and the second fuse point are selected, so that a connecting line 10 from the first fuse point to the second fuse point is formed, as shown in FIG. 4. Exemplarily, in order to reduce the resistance of the connecting line 10, the selected repair line 3 should be a repair line which has the shortest distance for connecting the first fuse point 7 and the second fuse point 8. Of course, for other purpose (e.g. in order to resistance match the connecting line 10 with the unbroken leading wire 1 in the peripheral circuit), the repair line 3 at other position may be selected.

The common repair line 2 is cut off according to the shape of the connecting line 10 as shown in FIG. 4. Of course, in consideration of cutting precise, damage by error, and so on, generally, cutting could not be carried out precisely according to the shape of the connecting line 10. In general, according to the shape of the connecting line 10, the cutting is done on the common repair line 2 at positions outside the first fuse point 7, the second fuse point 8 and parts of the common repair lines 2 forming the connecting line 10, for example, at the cut-off points 9, as shown in FIG. 3. The four cut-off points 9 are all located outside of the connecting line 10. The cut-off connecting line 10 will be used as a leading wire 1 in the peripheral circuit, so it is possible to quickly and effectively repair the broken leading wire 1 in the peripheral circuit.

It is noted that the cutting can be performed according to the practical situation. In the present embodiment, the cutting is done on the common repair line 2, and thus the cut-off point is at the common repair line 2. In addition, the cut-off point 9 could also be at the repair line 3, or some of cut-off points 9 are at the common repair line and some of cut-off points 9 are at the repair line 3. All these situations can be conceived according to the embodiment of the present invention.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. An array substrate, comprising:
   a display region;
   a peripheral region, in which a peripheral circuit comprising a plurality of leading wires spaced from each other is provided, and the peripheral region comprising:
   an insulation layer, provided above a layer in which the peripheral circuit is provided; and
   a leading wire repair layer, provided above the insulation layer,
   wherein the leading wire repair layer comprises at least two common repair lines extended along an arrangement direction of the leading wires in the peripheral circuit, and a plurality of repair lines electrically connected the at least two common repair lines are provided between the two adjacent common repair lines,
   wherein there are through holes provided in the insulation layer and the through holes are configured to electrically connect the common repair lines with a common electrode.

2. The array substrate according to claim 1, wherein the through holes are filled with conductive material for electrically connecting the common repair lines with the common electrode.

3. The array substrate according to claim 1 wherein the at least two of the common repair lines are respectively provided in set regions closed to both ends of the leading wires in the peripheral circuit.

4. The array substrate according to claim 1, wherein the repair lines are in a one-to-one correspondence relationship with the leading wires of the peripheral circuit in a position.

5. The array substrate according to claim 1, wherein the number of the repair lines is less than the number of the leading wires of the peripheral circuit, and there are at least two leading wires of the peripheral circuit between the two adjacent repair lines.

6. The array substrate according to claim 1, wherein the repair lines are perpendicular to the common repair lines; or, the repair lines are parallel with a segment of the leading wire of the peripheral circuit.

7. The array substrate according to claim 1, wherein the common repair lines and the repair lines are made from Cr, W, Cu, Ti, Ta, Mo or ITC.

8. The array substrate according to claim 1, wherein the insulation layer is one of a silicon oxide film, a silicon nitride film, a silicon oxynitride film and a composite structure comprising at least two above films.

9. The array substrate according to claim 1, wherein each of the leading wires is in zigzag shape.

10. A display device, comprising:
    the array substrate according to claim 1; and
    an opposed substrate, cell-assembled with the array substrate.

11. A repair method for the array substrate according to claim 1,
    wherein the array substrate is manufactured by a manufacturing method, the manufacturing method comprises the following steps:
    S11, forming gate lines, data lines and a common electrode in a display region on a substrate, and forming a peripheral circuit in a peripheral region, the peripheral circuit comprises a plurality of leading wires which are spaced from each other and electrically connected to the gate lines or the data lines;

S12, forming an insulation layer above a layer in which the peripheral circuit is disposed on the substrate formed in step S11;

Step S13, forming a leading wire repair layer in the peripheral region of the substrate formed in the above step S12, the leading wire repair layer is provided above the insulation layer;

the repair method, comprising:

S21, in a condition that the leading wire in the peripheral circuit is broken, two ends at a breakage point of the broken leading wire in the peripheral circuit are fused with the common repair lines at overlap positions where the broken leading wire are intersected with the common repair lines, to form a first fuse point and a second fuse point electrically connecting the broken leading wire and the common repair lines;

S22, selecting one repair line which is nearest to the first fuse point and the second fuse point, to form a connecting line from the first fuse point to the second fuse point, and disconnecting the connecting line from the common repair line so that the connecting line is used to take the place of the broken leading wire in the peripheral circuit.

12. The repair method according to claim 11, wherein the common repair lines fused in the step S21 is two common repair lines each which has the shortest distance from the two ends broken at the breakage point.

13. The repair method according to claim 11, wherein disconnecting points for disconnecting the connecting line from the common repair lines are located at the common repair lines or at the repair line; or some of the disconnecting points are located at the common repair lines and some of the disconnecting points are located at the repair line.

14. The repair method according to claim 12, wherein disconnecting points for disconnecting the connecting line from the common repair lines are located at the common repair lines or at the repair line; or some of the disconnecting points are located at the common repair lines and some of the disconnecting points are located at the repair line.

\* \* \* \* \*